(12) United States Patent
Sahashi

(10) Patent No.: US 12,463,119 B2
(45) Date of Patent: Nov. 4, 2025

(54) SEMICONDUCTOR DEVICE AND SEMICONDUCTOR DEVICE MANUFACTURING METHOD

(71) Applicant: Sumitomo Electric Device Innovations, Inc., Yokohama (JP)

(72) Inventor: Akira Sahashi, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 515 days.

(21) Appl. No.: 17/959,472

(22) Filed: Oct. 4, 2022

(65) Prior Publication Data
US 2023/0107764 A1 Apr. 6, 2023

(30) Foreign Application Priority Data
Oct. 5, 2021 (JP) .................................. 2021-163985

(51) Int. Cl.
*H01L 23/495* (2006.01)
*H01L 21/56* (2006.01)
(Continued)

(52) U.S. Cl.
CPC ...... *H01L 23/49568* (2013.01); *H01L 21/565* (2013.01); *H01L 23/3121* (2013.01); *H01L 23/49531* (2013.01); *H01L 23/49562* (2013.01); *H01L 23/49565* (2013.01); *H01L 23/49575* (2013.01); *H01L 23/66* (2013.01); *H01L 24/32* (2013.01); *H01L 24/48* (2013.01); *H01L 24/73* (2013.01); *H01L 25/072* (2013.01); *H01L 23/552* (2013.01); *H01L 2223/6611* (2013.01);
(Continued)

(58) Field of Classification Search
CPC ......... H01L 23/49575; H01L 23/49506; H01L 23/49568; H01L 23/49555; H01L 23/49551; H01L 23/49541; H01L 23/4951; H01L 23/49531; H01L 23/3178; H01L 2924/181; H01L 21/565; H01L 21/566; H01L 21/4871–4882; H01L 2023/4056; H01L 2023/405; H01L 2023/4037–4068; H01L 23/495–49596; H01L 23/3121–312; H01L 23/3107–3114; H05K 2201/066; H05K 1/21
See application file for complete search history.

(56) References Cited

U.S. PATENT DOCUMENTS

| | | | |
|---|---|---|---|
| 6,043,111 A | 3/2000 | Furuse | |
| 2017/0047274 A1* | 2/2017 | Shibuya | ............ H01L 23/49568 |

(Continued)

FOREIGN PATENT DOCUMENTS

| | | | | |
|---|---|---|---|---|
| CN | 107104089 A | * | 8/2017 | ......... H01L 21/4825 |
| JP | 10-050891 A | | 2/1998 | |

OTHER PUBLICATIONS

English translation of CN-107104089-A (Year: 2017).*

*Primary Examiner* — Zandra V Smith
*Assistant Examiner* — Douglas Yap
(74) *Attorney, Agent, or Firm* — Volpe Koenig

(57) ABSTRACT

A semiconductor device includes: a package having a top surface and a bottom surface; a semiconductor element arranged in the package; and a base which is arranged in the package and on which the semiconductor element is mounted. A top surface of the base is exposed to the top surface of the package, and a bottom surface of the base is exposed to the bottom surface of the package.

11 Claims, 12 Drawing Sheets

(51) Int. Cl.
*H01L 23/00* (2006.01)
*H01L 23/31* (2006.01)
*H01L 23/66* (2006.01)
*H01L 25/07* (2006.01)
*H01L 23/552* (2006.01)

(52) U.S. Cl.
CPC .............. *H01L 2223/6672* (2013.01); *H01L 2224/32245* (2013.01); *H01L 2224/48155* (2013.01); *H01L 2224/73265* (2013.01); *H01L 2924/1033* (2013.01); *H01L 2924/30111* (2013.01)

(56) References Cited

U.S. PATENT DOCUMENTS

| | | | | |
|---|---|---|---|---|
| 2017/0179009 | A1* | 6/2017 | Otremba | H01L 23/49558 |
| 2018/0233438 | A1* | 8/2018 | Bemmerl | H01L 23/49524 |
| 2020/0258829 | A1* | 8/2020 | Ting | H01L 23/3114 |
| 2022/0148947 | A1* | 5/2022 | Park | H01L 23/49562 |
| 2022/0238421 | A1* | 7/2022 | Quinones | H01L 23/49524 |

\* cited by examiner

SEMICONDUCTOR DEVICE AND SEMICONDUCTOR DEVICE MANUFACTURING METHOD

TECHNICAL FIELD

The present disclosure relates to a semiconductor device and a semiconductor device manufacturing method. This application is based upon and claims the benefit of the priority from Japanese Patent Application No. 2021-163985, filed on Oct. 5, 2021, the entire contents of which are incorporated herein by reference.

BACKGROUND

Japanese Unexamined Patent Publication No. H10-50891 describes a semiconductor device. This semiconductor device includes a lead frame and a semiconductor element. The semiconductor element is mounted on the front surface of the lead frame.

SUMMARY

The present disclosure provides a semiconductor device. The semiconductor device includes: a package having a top surface and a bottom surface; a semiconductor element arranged in the package; and a base which is arranged in the package and on which the semiconductor element is mounted. A top surface of the base is exposed to the top surface of the package, and a bottom surface of the base is exposed to the bottom surface of the package.

The present disclosure provides a semiconductor device manufacturing method. A semiconductor device includes: a package having a top surface and a bottom surface; a semiconductor element arranged in the package; and a base which is arranged in the package and on which the semiconductor element is mounted. A top surface of the base is exposed to the top surface of the package, and a bottom surface of the base is exposed to the bottom surface of the package. The method includes: a step of mounting the semiconductor element on the base; a step of making the semiconductor element and an external terminal electrically connected to each other with a conductive member; and a step of sealing the base, the external terminal, and the semiconductor element with a resin material.

DETAILED DESCRIPTION

Figure 1:
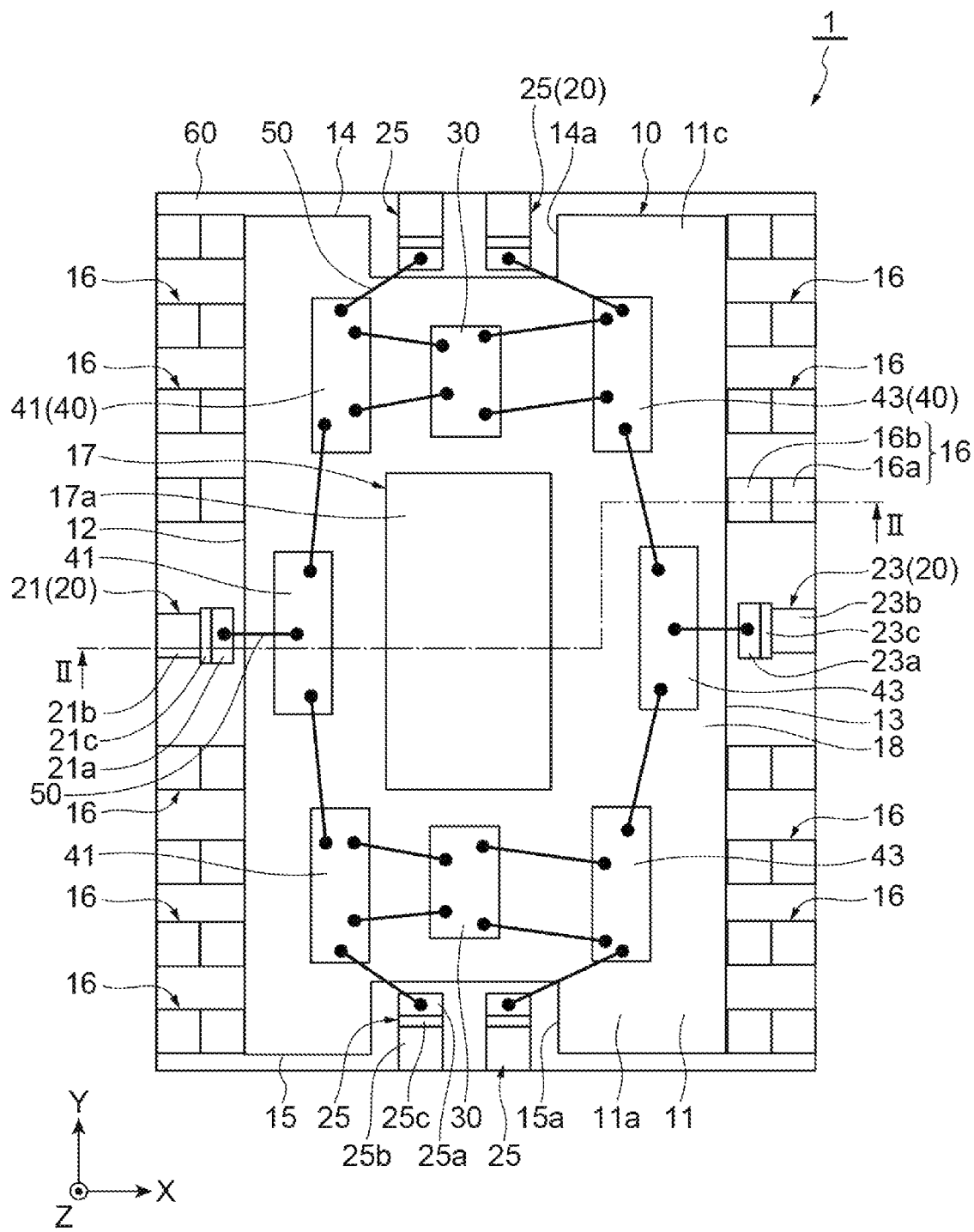
FIG. 1 is a plan view schematically showing the configuration of a semiconductor device in an example.

In a semiconductor device in which a semiconductor element is mounted on a lead frame, heat generated by the semiconductor element can be dissipated through the lead frame. For example, when a semiconductor device includes a lead frame and a semiconductor element mounted on the front surface of the lead frame, the heat generated by the semiconductor element can be dissipated to a heat sink by bringing the back surface of the lead frame opposite to the front surface into contact with the heat sink. However, for example, when heat dissipation is concentrated in a region between a plurality of semiconductor elements mounted on the lead frame, it is conceivable that the temperature of the heat sink corresponding to the region tends to rise and the heat dissipation performance is degraded.

The present disclosure provides a semiconductor device capable of efficiently dissipating heat generated by a semiconductor element.

Description of Embodiments of the Present Disclosure

A semiconductor device according to an embodiment includes: a package having a top surface and a bottom surface; a semiconductor element arranged in the package; and a base which is arranged in the package and on which the semiconductor element is mounted. A top surface of the base is exposed to the top surface of the package, and a bottom surface of the base is exposed to the bottom surface of the package.

In a semiconductor device manufacturing method according to an embodiment, a semiconductor device includes: a package having a top surface and a bottom surface; a semiconductor element arranged in the package; and a base which is arranged in the package and on which the semiconductor element is mounted. A top surface of the base is exposed to the top surface of the package. A bottom surface of the base is exposed to the bottom surface of the package. The method includes: a step of mounting the semiconductor element on the base; a step of making the semiconductor element and an external terminal electrically connected to each other with a conductive member; and a step of sealing the base, the external terminal, and the semiconductor element with a resin material.

In the semiconductor device described above, the base on which the semiconductor is mounted has a top surface and a bottom surface exposed from the package. For this reason, the heat generated by the semiconductor element can be dissipated from the top and bottom surfaces of the base. Therefore, the heat generated by the semiconductor element can be efficiently dissipated.

The exposed top and bottom surfaces of the base may be thermally connected to an external heat sink. In this configuration, heat can be efficiently dissipated through the heat sink.

The semiconductor device described above may further include an external terminal electrically connected to the semiconductor element and having a surface exposed from the top surface or the bottom surface of the package. A plurality of semiconductor elements may be mounted on the base. The exposed top surface of the base may be provided between the plurality of semiconductor elements. The base may have a slit between the exposed top surface of the base and a position where the semiconductor element is mounted. In this configuration, the top surface side and the bottom surface side of the base communicate with each other through the slit. Therefore, for example, the resin material injected from the top surface side can be made to easily flow to the bottom surface side.

The exposed top surface of the base and a position where the semiconductor element is mounted may be continuous. In this configuration, the heat generated by the semiconductor element can be conducted to the exposed top surface of the base.

The semiconductor device described above may further include a ground terminal having a surface exposed to the top surface of the package and electrically connected to the base. In this configuration, the top surface of the base exposed from the package can be used as a ground terminal.

A thickness of the ground terminal may be smaller than a thickness of the base. In this configuration, conduction of the heat generated by the semiconductor element to the ground terminal is suppressed.

In the manufacturing method described above, the base may have a slit between the exposed top surface of the base and a position where the semiconductor element is mounted, and the step of sealing using the resin material may include a step of injecting resin into the slit of the base.

Details of Embodiments of the Present Invention

Specific examples of a semiconductor device of the present disclosure will be described below with reference to the drawings. The present invention is not limited to the examples, but is indicated by the appended claims and is intended to include all modifications within the meaning and scope equivalent to the appended claims. In the following description, the same elements will be designated by the same reference numerals in the description of the drawings, and redundant description will be omitted.

Figure 2:
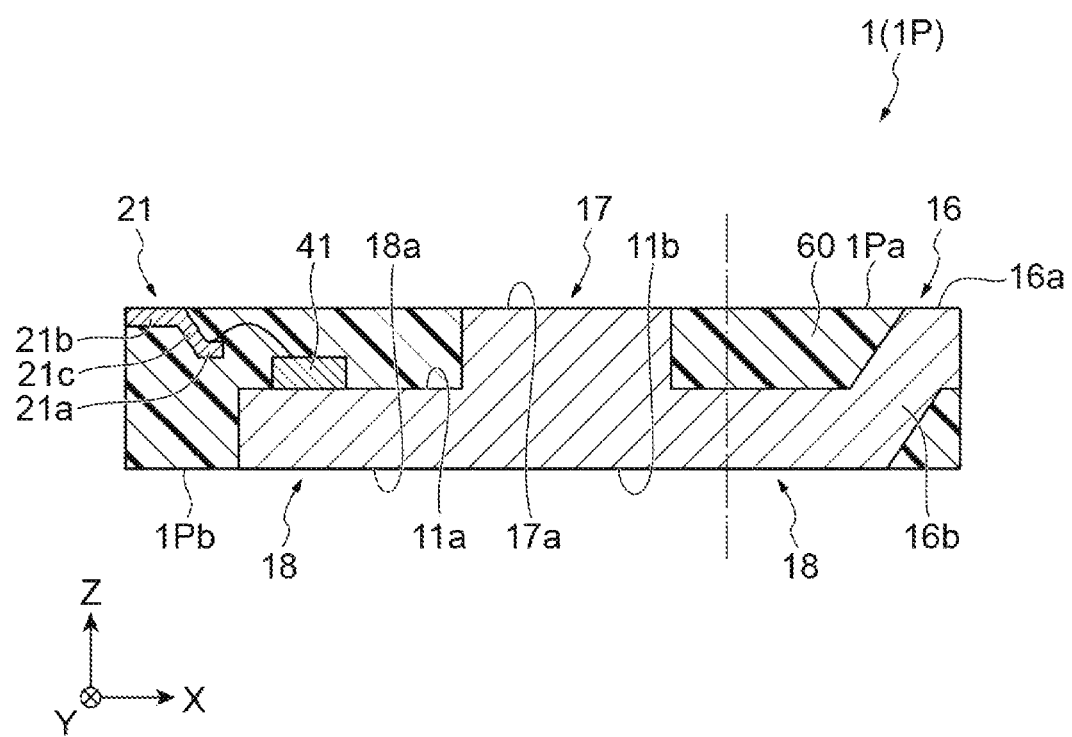
FIG. 2 is a cross-sectional view taken along the line II-II in FIG. 1.

FIG. 1 is a plan view schematically showing the configuration of a semiconductor device in an example. FIG. 2 is a cross-sectional view taken along the line II-II in FIG. 1. In the following description, the XYZ orthogonal coordinate system shown in the diagrams may be referred to. As shown in FIGS. 1 and 2, a package 1P forming a semiconductor device 1 in an example includes a lead frame 10 (base), an external terminal 20, a semiconductor element 30, a matching circuit board 40, a bonding wire 50, and a resin material 60. In addition, in FIG. 1, a portion covered with the resin material 60 is also drawn with a solid line.

The lead frame 10 in an example is a plate-shaped member having conductivity. The lead frame 10 can be formed of, for example, copper, a copper-molybdenum alloy, a copper-tungsten alloy, or a stacked material of a copper plate, a molybdenum plate, a tungsten plate, a copper-molybdenum alloy plate, or a copper-tungsten alloy plate. The lead frame 10 in the illustrated example may be formed of copper. In addition, the material of the lead frame 10 is not limited to the above.

The lead frame 10 includes a lead frame body 11 having an approximately rectangular plate shape. The lead frame body 11 has a front surface 11a (first surface) on which the semiconductor element 30 and the matching circuit board 40 are mounted and a back surface 11b (second surface) opposite to the front surface 11a. In FIGS. 1 and 2, the front surface 11a and the back surface 11b extend along the XY plane. Therefore, the thickness direction of the lead frame 10 is along the Z direction.

As shown in FIG. 1, the outer shape of a peripheral edge 11c of the lead frame body 11 is approximately rectangular. That is, the lead frame body 11 includes a first side 12 and a second side 13 extending along the Y direction and a third side 14 and a fourth side 15 extending along the X direction. The first side 12 and the second side 13 face each other in the X direction. The third side 14 and the fourth side 15 face each other in the Y direction. The first side 12 and the second side 13 are connected to each other by a third side 14 and a fourth side 15.

The lead frame 10 includes a ground terminal 16. The ground terminal 16 is provided on the peripheral edge 11c of the lead frame body 11. In addition, when viewed from the Z direction, the ground terminal 16 extends outward from the peripheral edge 11c of the lead frame 10. The ground terminal 16 in the illustrated example is provided on the first side 12 and the second side 13. In the illustrated example, a total of eight ground terminals 16 are provided on each of the first side 12 and the second side 13. As shown in FIG. 2, the ground terminal 16 includes a first portion 16a, which extends along the XY plane at a position away from the lead frame body 11 in the Z direction, and a second portion 16b connecting the first portion 16a and the lead frame body 11 to each other. In addition, in an example, the ground terminal 16 may be manufactured by bending (pressing) a metal plate that has a predetermined shape and forms the lead frame 10. In this case, the bending line in the bending process extends along the Y direction.

As the external terminal 20, an input signal terminal 21 and an output signal terminal 23 are included. The input signal terminal 21 is provided on the first side 12 of the lead frame 10, and the output signal terminal 23 is provided on the second side 13 of the lead frame 10. That is, as shown in FIG. 2, the input signal terminal 21 is arranged close to the first side 12 of the peripheral edge 11c of the front surface 11a of the lead frame 10. The input signal terminal 21 includes a first portion 21a extending along the XY plane at a position close to the lead frame body 11 in the Z direction, a second portion 21b extending along the XY plane at a position farther from the lead frame body 11 than the first portion 21a, and a third portion 21c connecting the first portion 21a and the second portion 21b to each other. For example, a plurality of input signal terminals 21 may be arranged so as to face the first side 12 and be spaced apart from each other in the Y direction. In the illustrated example, the input signal terminal 21 is arranged at the center in the Y direction.

Similarly, the output signal terminal 23 is arranged close to the second side 13 of the peripheral edge 11c of the front surface 11a of the lead frame 10. The output signal terminal 23 includes a first portion 23a extending along the XY plane at a position close to the lead frame body 11 in the Z direction, a second portion 23b extending along the XY plane at a position farther from the lead frame body 11 than the first portion 23a, and a third portion 23c connecting the first portion 23a and the second portion 23b to each other. For example, a plurality of output signal terminals 23 may be arranged so as to face the second side 13 and be spaced apart from each other in the Y direction. In the illustrated example, the output signal terminal 23 is arranged at the center in the Y direction.

In addition, as the external terminal 20, a power supply terminal 25 is included. In the illustrated example, four power supply terminals 25 are shown. Two power supply terminals 25 are arranged close to the third side 14, and the remaining two power supply terminals 25 are arranged close to the fourth side 15. The power supply terminal 25 in an example is spaced apart from the lead frame body 11 when viewed from the Z direction. In the illustrated example, rectangular notch-shaped constricted portions 14a and 15a are provided on the third side 14 and the fourth side 15 of the lead frame body 11, respectively, and the power supply terminal 25 is arranged in each of the constricted portions 14a and 15a. For example, the power supply terminal 25 may include a first portion 25a extending along the XY plane at a position close to the lead frame body 11 in the Z direction, a second portion 25b extending along the XY plane at a position farther from the lead frame body 11 than the first portion 25a, and a third portion 25c connecting the first portion 25a and the second portion 25b to each other. The position of the second portion 25b of the power supply terminal 25 in the Z direction may be the same as the position of the second portion 21b of the input signal terminal 21, the position of the second portion 23b of the output signal terminal 23, and the position of the first portion 16a of the ground terminal 16.

The semiconductor element 30 is mounted on the front surface 11a of the lead frame 10. The adhesive for bonding the semiconductor element 30 onto the front surface 11a of the lead frame 10 may be a conductive adhesive, such as silver paste. The semiconductor element 30 may be, for example, a gallium nitride (GaN)-based transistor, but is not limited thereto. For example, the semiconductor element 30 may be a transistor including a substrate formed of Si, SiC, GaN, GaAs, diamond, or the like. The semiconductor element 30 includes electrodes including a drain electrode, a source electrode and a gate electrode, and is electrically connected to other elements or terminals through these electrodes. In the illustrated example, two semiconductor elements 30 are mounted on the front surface 11a of the lead frame body 11.

The matching circuit board 40 is mounted on the front surface 11a of the lead frame 10. The adhesive for bonding the matching circuit board 40 onto the front surface 11a of the lead frame 10 may be a conductive adhesive such as silver paste. The matching circuit board 40 may be an input circuit board 41 or an output circuit board 43. The input circuit board 41 performs impedance matching between the input signal terminal 21 and the semiconductor element 30. The output circuit board 43 performs impedance matching between the output signal terminal 23 and the semiconductor element 30. The input circuit board 41 and the output circuit board 43 are, for example, parallel plate type capacitor in which an electrode is provided on each of the top and bottom surfaces of a ceramic substrate. In addition, the matching circuit board 40 may be a capacitor formed with a Si-MOS structure. The matching circuit board 40 is electrically connected to the semiconductor element 30, the external terminal 20, and the power supply terminals 25.

The bonding wire 50 (conductive member) is a member for making the components of the semiconductor device 1 electrically connected to each other. The semiconductor device 1 in an example includes a plurality of bonding wire 50. The bonding wire 50 is formed of, for example, metal such as gold (Au). By the bonding wire 50, the input signal terminal 21 and the input circuit board 41 are electrically connected to each other, the input circuit board 41 and the semiconductor element 30 are electrically connected to each other, the input circuit board 41 and the power supply terminal 25 are electrically connected to each other, the semiconductor element 30 and the output circuit board 43 are electrically connected to each other, the output circuit board 43 and the power supply terminal 25 are electrically connected to each other, and the output circuit board 43 and the output signal terminal 23 are electrically connected to each other. Therefore, the semiconductor element 30 and the input signal terminal 21 and the output signal terminal 23 are electrically connected to each other.

On the lead frame 10 of the semiconductor device 1 in an example, as shown in FIG. 1, three input circuit boards 41, two semiconductor elements 30, and three output circuit boards 43 are mounted from the first side 12 close to the input signal terminal 21 to the second side 13 close to the output signal terminal 23.

The resin material 60 seals the lead frame 10, the semiconductor element 30, the matching circuit board 40 and the external terminal 20. In the semiconductor device 1 in an example, a part of the lead frame 10, the semiconductor element 30, a part of the external terminal 20, and the bonding wire 50 are sealed with the resin material 60. In the semiconductor device 1 in an example, the second portion 21b of the input signal terminal 21, the second portion 23b of the output signal terminal 23, the first portion 16a of the ground terminal 16, and the second portion 25b of the power supply terminal 25 are exposed from the resin material 60. In addition, parts of the back surface 11b and the front surface 11a of the lead frame 10 are also exposed from the resin material 60. The resin material 60 may be, for example, a resin such as a thermosetting epoxy resin.

Hereinafter, the semiconductor device 1 in an example will be described in more detail.

The lead frame 10 includes a first heat dissipation region 17 and a second heat dissipation region 18. The first heat dissipation region 17 has a first heat dissipation surface 17a (top surface) for dissipating heat from the front surface 11a. As shown in FIG. 1, the first heat dissipation region 17 in an example is located at the center of the lead frame 10 in plan view. In the illustrated example, the first heat dissipation region 17 has a rectangular shape with peripheral edges along the X and Y directions. The first heat dissipation region 17 is formed as a columnar region protruding in a direction from the back surface 11b toward the front surface 11a in the lead frame 10. The first heat dissipation surface 17a is an end surface of the first heat dissipation region 17 in the protruding direction. The position of the first heat dissipation surface 17a in the Z direction is farther from the front surface 11a of the second heat dissipation region 18 than the upper end surfaces of the semiconductor element 30 and the matching circuit board 40. The position of the first heat dissipation surface 17a in the Z direction may be the same as the position of the second portion 25b of the power supply terminal 25, the position of the second portion 21b of the input signal terminal 21, the position of the second portion 23b of the output signal terminal 23, and the position of the first portion 16a of the ground terminal 16. In the semiconductor device 1, the first heat dissipation surface 17a is exposed from the resin material 60. In addition, the first heat dissipation surface 17a may be partially covered with the resin material 60.

The second heat dissipation region 18 has a second heat dissipation surface 18a (bottom surface) for dissipating heat from the back surface 11b. As shown in FIG. 1, the second heat dissipation region 18 in an example surrounds the four sides of the first heat dissipation region 17 in plan view. The second heat dissipation region 18 in the illustrated example is a region of the lead frame body 11 that is not the first heat dissipation region 17. Therefore, the outer shape of the second heat dissipation region 18 matches the outer shape of the lead frame body 11 and is a rectangular shape.

Assuming that the direction in which the first side 12 and the second side 13 defining the outer shape of the second heat dissipation region 18 are connected to each other is a first direction, that is, assuming that the X direction in the diagrams is the first direction, the first heat dissipation region 17 and the second heat dissipation region 18 include portions adjacent to each other in the first direction. More specifically, the first heat dissipation region 17 is interposed between portions of the second heat dissipation region 18 in the first direction. Similarly, assuming that the direction in which the third side 14 and the fourth side 15 defining the outer shape of the second heat dissipation region 18 are connected to each other is a second direction, that is, assuming that the Y direction in the diagrams is the second direction, the first heat dissipation region 17 and the second heat dissipation region 18 include portions adjacent to each other in the second direction. More specifically, the first heat dissipation region 17 is interposed between portions of the second heat dissipation region 18 in the second direction.

In addition, in the semiconductor device 1 shown in FIGS. 1 and 2, the back surface 11b of the lead frame body 11 is exposed from the resin material 60 and can function as a heat dissipation surface over the entire area. In this manner, the back surface of the first heat dissipation region 17 can also function as a heat dissipation surface. In this specification, however, even a region where heat can be dissipated from the back surface is the first heat dissipation region 17 when the front surface functions as a heat dissipation surface.

The semiconductor element 30 and the matching circuit board 40 are mounted on the front surface 11a of the second heat dissipation region 18. The semiconductor elements 30 in an example are provided at positions, between which the first heat dissipation region 17 is interposed in the second direction (Y direction), in the second heat dissipation region 18. In addition, three input circuit boards 41 are arranged so as to be spaced apart from the front surface 11a of the second heat dissipation region 18, which is located between the first heat dissipation region 17 and the first side 12 in the X direction, along the Y direction. Three output circuit boards 43 are arranged so as to be spaced apart from the front surface 11a of the second heat dissipation region 18, which is located between the first heat dissipation region 17 and the second side 13 in the X direction, along the Y direction. The input circuit board 41 located at the center in the Y direction and the output circuit board 43 located at the center in the Y direction are provided at positions between which the first heat dissipation region 17 is interposed in the X direction.

The input signal terminal 21 is arranged in the vicinity of the first side 12 so that the distance from the first side 12 among the first side 12, the second side 13, the third side 14, and the fourth side 15 is the shortest. The position of the input signal terminal 21 in the Y direction corresponds to the position of the input circuit board 41 located at the center in the Y direction. That is, the input signal terminal 21 faces the central input circuit board 41 in the X direction.

Similarly, the output signal terminal 23 is arranged in the vicinity of the second side 13 so that the distance from the second side 13 among the second side 13, the second side 13, the third side 14, and the fourth side 15 is the shortest. The position of the output signal terminal 23 in the Y direction corresponds to the position of the output circuit board 43 located at the center in the Y direction. That is, the output signal terminal 23 faces the central output circuit board 43 in the X direction.

Figure 3:
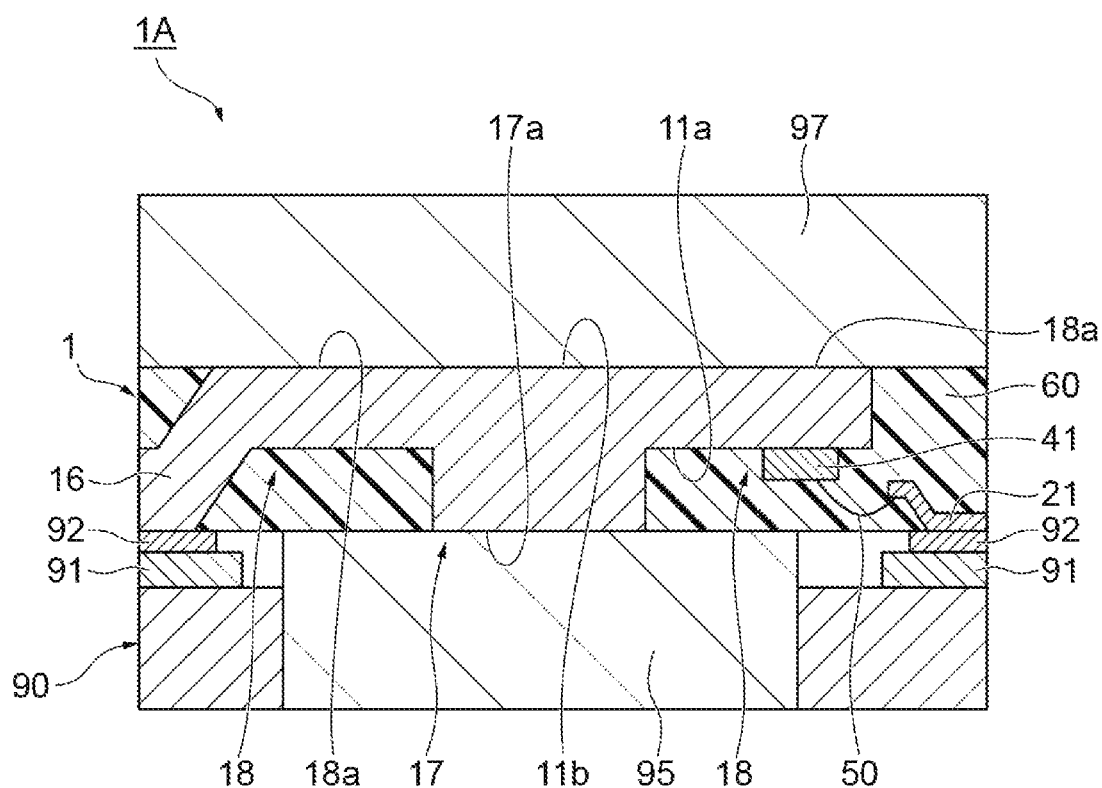
FIG. 3 is a cross-sectional view showing a semiconductor device in which the semiconductor device in an example is mounted on a substrate.

FIG. 3 is a cross-sectional view schematically showing a semiconductor device 1A in which the semiconductor device 1 in an example is mounted on a substrate 90. As shown in FIG. 3, in the semiconductor device 1A, the external terminal 20 and the ground terminal 16 of the semiconductor device 1 are connected to a circuit pattern 91 formed on the substrate 90 through solder paste 92. In an example, the substrate 90 has a heat sink 95 (first heat sink) at a position corresponding to the first heat dissipation region 17. In a state in which the semiconductor device 1 is mounted on the substrate 90, the heat sink 95 is in contact with the first heat dissipation surface 17a of the first heat dissipation region 17. That is, the first heat dissipation surface 17a is thermally connected to the heat sink 95. In addition, in the example of FIG. 3, another heat sink 97 (second heat sink) is provided on the second heat dissipation surface 18a side of the second heat dissipation region 18. The heat sink 97 is fixed to the substrate 90 or the semiconductor device 1 while being in contact with the second heat dissipation surface 18a. That is, the second heat dissipation surface 18a is thermally connected to the heat sink 97. In addition, since the heat sink 97 is in contact with the back surface 11b of the lead frame 10, the heat sink 97 is also in contact with the back surface of the first heat dissipation region 17.

As described above, the semiconductor device 1 in an example includes: a lead frame 10 that has a front surface 11a and a back surface 11b opposite to the front surface 11a and includes a first heat dissipation region 17 having a first heat dissipation surface 17a for dissipating heat from the front surface 11a and a second heat dissipation region 18 having a second heat dissipation surface 18a for dissipating heat from the back surface 11b; a semiconductor element 30 mounted on the front surface 11a of the second heat dissipation region 18 of the lead frame 10; a resin material 60 that seals the lead frame 10 and the semiconductor element 30; and an external terminal 20 that is electrically connected to the semiconductor element 30 and partly exposed from the resin material 60. In other words, the semiconductor device 1 in an example includes a package 1P having a top surface 1Pa and a bottom surface 1Pb, the semiconductor element 30 arranged in the package 1P, and the lead frame 10 which is arranged in the package 1P and on which the semiconductor element 30 is mounted, the first heat dissipation surface 17a forming the top surface of the lead frame 10 is exposed to the top surface 1Pa of the package 1P, and the second heat dissipation surface 18a forming the bottom surface of the lead frame 10 is exposed to the bottom surface 1Pb of the package 1P.

In the semiconductor device 1 described above, the heat generated by the semiconductor element 30 mounted on the front surface 11a of the second heat dissipation region 18 is dissipated through the lead frame 10. In the second heat dissipation region 18, the back surface 11b corresponding to the position where the semiconductor element 30 is mounted is used as the second heat dissipation surface 18a, so that the heat generated by the semiconductor element 30 can be dissipated from the second heat dissipation surface 18a. In addition, the semiconductor device 1 includes the first heat dissipation region 17 having the first heat dissipation surface 17a for dissipating heat from the front surface 11a. In this case, the amount of heat dissipated by the second heat dissipation surface 18a can be reduced by the amount of heat dissipated by the first heat dissipation surface 17a. As in the illustrated example, when the heat sink 95 and the heat sink 97 in contact with the first heat dissipation surface 17*a* and the second heat dissipation surface 18*a*, respectively, are provided, the heat generated by the semiconductor element 30 is dispersed to the heat sink 95 and the heat sink 97 to be dissipated. Therefore, the heat generated by the semiconductor element 30 can be efficiently dissipated.

At least parts of the first heat dissipation surface 17*a* and the second heat dissipation surface 18*a* as examples may be exposed from the resin material 60. In this configuration, for example, the first heat dissipation surface 17*a* and the second heat dissipation surface 18*a* can be easily brought into contact with a heat sink or the like.

The semiconductor device 1 may have a matching circuit board 40 that is connected to the semiconductor element 30 and is mounted on the front surface 11*a* of the second heat dissipation region 18 at each of positions between which the first heat dissipation region 17 is interposed in the first direction. In this configuration, since the first heat dissipation region 17 protruding to the front surface 11*a* side suppresses the propagation of electromagnetic waves in the space, the isolation between the matching circuit boards 40 arranged at positions between which the first heat dissipation region 17 is interposed is improved. In the illustrated example, the isolation between the output circuit board 43 and the input circuit board 41 arranged at the center in the Y direction is improved.

A ground terminal 16 that is connected to the second heat dissipation region 18 and has a connection surface on the front surface 11*a* side may be provided on the first side 12 and the second side 13 of the lead frame 10 in an example. In this configuration, the first heat dissipation region 17 having a heat dissipation surface on the front surface 11*a* side can also be used as a ground terminal.

While the form of an example of the present disclosure has been described in detail above, the present disclosure is not limited to the above form.

Figure 4:
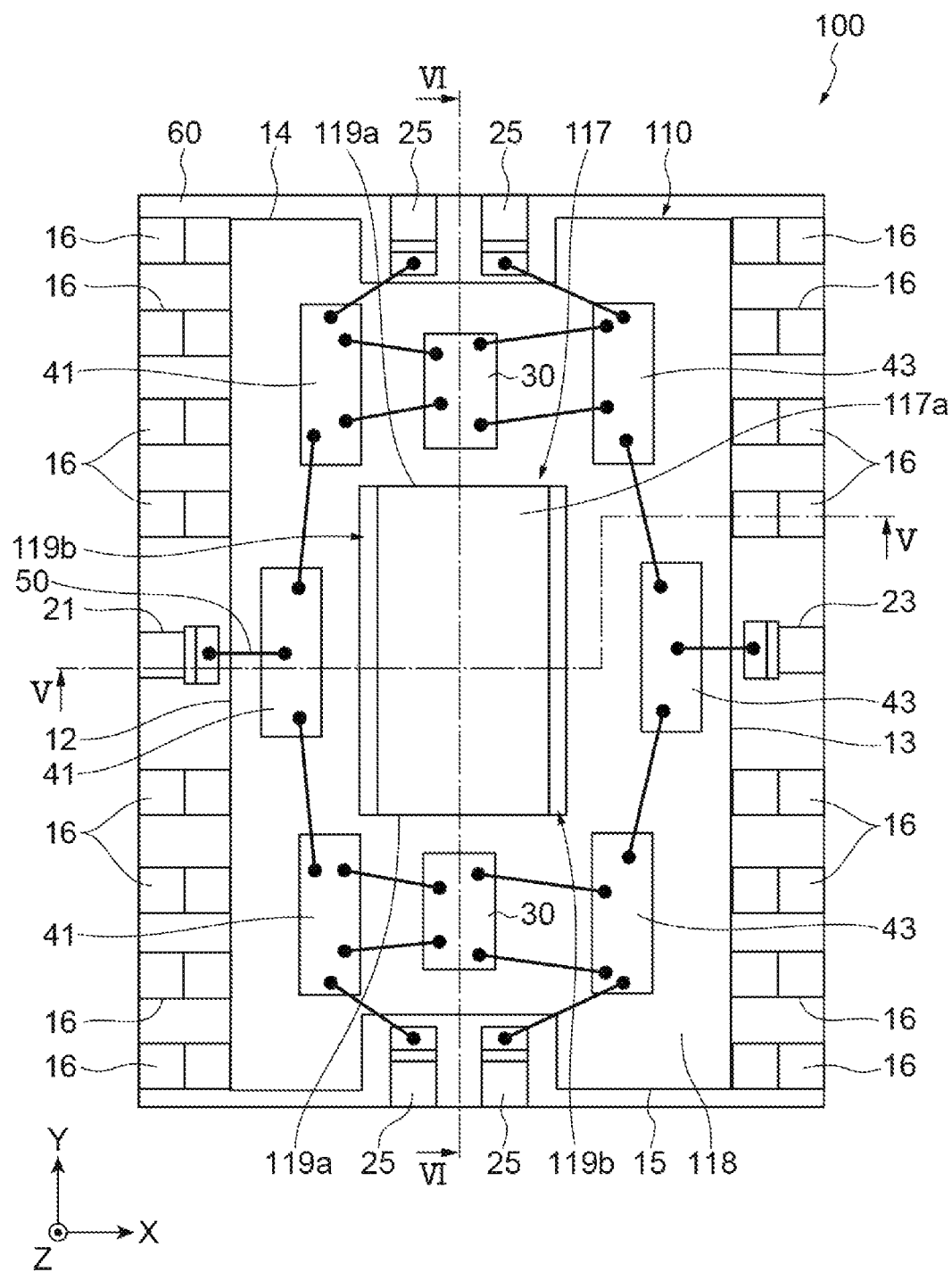
FIG. 4 is a plan view schematically showing the configuration of a semiconductor device as another example.
Figure 5:
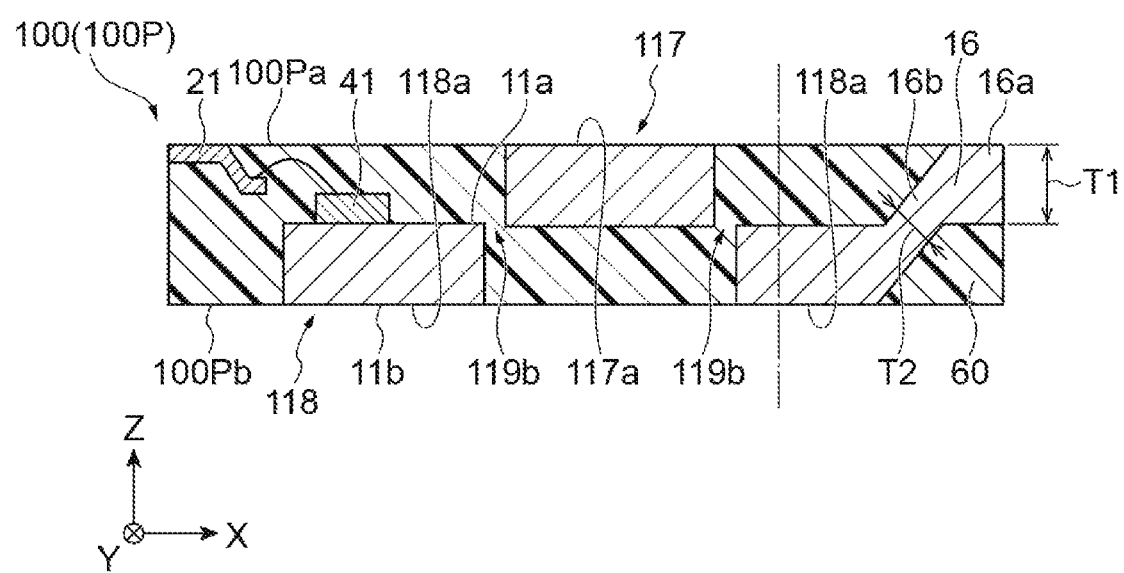
FIG. 5 is a cross-sectional view taken along the line V-V in FIG. 4.
Figure 6:
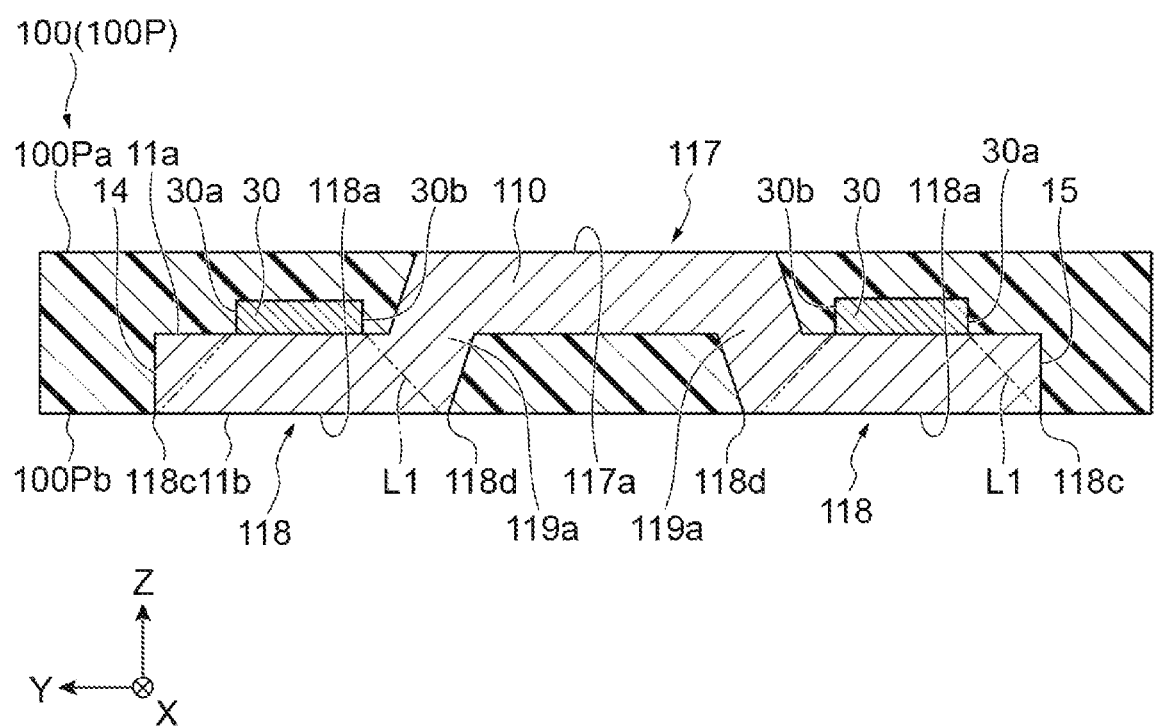
FIG. 6 is a cross-sectional view taken along the line VI-VI of FIG. 4.

FIG. 4 is a plan view schematically showing the configuration of a semiconductor device in another example. FIG. 5 is a cross-sectional view taken along the line V-V in FIG. 4. FIG. 6 is a cross-sectional view taken along the line VI-VI of FIG. 4. A semiconductor device 100 shown in FIGS. 4 to 6 is mainly different from the semiconductor device 1 shown in FIGS. 1 to 3 in that the semiconductor device 100 has a first heat dissipation region 117 instead of the first heat dissipation region 17. A package 100P forming the semiconductor device 100 can be mounted on the substrate 90 in the same manner as the semiconductor device 1 in FIG. 3. In the following description of the semiconductor device 100, the description of the configuration overlapping that of the semiconductor device 1 will be omitted.

As shown in FIGS. 4 to 6, a lead frame 110 (base) of the semiconductor device 100 includes the first heat dissipation region 117 (top surface) and a second heat dissipation region 118 (bottom surface). The first heat dissipation region 117 has a first heat dissipation surface 117*a* that dissipates heat from the front surface 11*a*. The first heat dissipation region 117 in an example is located at the center of the lead frame 110 in plan view. The second heat dissipation region 118 is a region of the lead frame 110 that is not the first heat dissipation region 117, similarly to the second heat dissipation region 18 of the semiconductor device 1.

In the illustrated example, the first heat dissipation region 117 has a rectangular plate shape with peripheral edges along the X and Y directions. The first heat dissipation region 117 is formed by partial rising of the lead frame 110 in a direction from the back surface 11*b* toward the front surface 11*a*. Such a shape can be formed, for example, by bending. The first heat dissipation region 117 in the illustrated example includes the first heat dissipation surface 117*a* extending in the X and Y directions at a position shifted in the Z direction from the second heat dissipation region 118. The first heat dissipation region 117 is connected to the second heat dissipation region 118 through a wall portion 119*a* extending along the XZ plane. The wall portion 119*a* is formed by a part of the lead frame 110 and connects both edges of the first heat dissipation region 117 in the Y direction and the second heat dissipation region 118 to each other.

The position of the first heat dissipation surface 117*a* in the Z direction is farther from the front surface 11*a* of the second heat dissipation region 118 than the upper end surfaces of the semiconductor element 30 and the matching circuit board 40. The position of the first heat dissipation surface 117*a* of the first heat dissipation region 117 in the Z direction may be the same as the position of the second portion 25*b* of the power supply terminal 25, the position of the second portion 21*b* of the input signal terminal 21, the position of the second portion 23*b* of the output signal terminal 23, and the position of the first portion 16*a* of the ground terminal 16. In the semiconductor device 100, the first heat dissipation surface 117*a* is exposed from the resin material 60. In addition, the first heat dissipation surface 117*a* may be partially covered with the resin material 60.

As shown in FIG. 5, a slit 119*b* (gap) that makes the first heat dissipation region 117 and the second heat dissipation region 118 spaced apart from each other in the X direction is formed in at least a part between the first heat dissipation region 117 and the second heat dissipation region 118. In an example, the slit 119*b* extends in the Y direction at both edges of the first heat dissipation region 117 in the X direction. In the illustrated example, the slit 119*b* is formed over the entire first heat dissipation region 117 in the Y direction. For example, the slit 119*b* is formed between the first heat dissipation region 117 of the lead frame 110 exposed from the top surface 100Pa of the package 100P and the position where the input circuit board 41 and the output circuit board 43 are mounted.

In addition, in the semiconductor device 100, the thickness of the ground terminal 16 is smaller than the thicknesses of the first heat dissipation region 117 and the second heat dissipation region 118. In addition, the thickness T1 of the ground terminal 16 in the first portion 16*a* may be the size in the Z direction. In addition, as shown in FIG. 5, the thickness T2 of the ground terminal 16 in the second portion 16*b* may be a size along a direction perpendicular to the extending direction of the second portion 16*b*. In an example, the thicknesses T1 and T2 may be the same size. In addition, the thickness T3 of the first heat dissipation region 117 and the second heat dissipation region 118 may be the size of the lead frame 110 in the Z direction. In the illustrated example, an example is shown in which the thickness of the first heat dissipation region 117 and the thickness of the second heat dissipation region 118 are the same. However, the thickness of the first heat dissipation region 117 and the thickness of the second heat dissipation region 118 may be different from each other.

As shown in FIG. 6, the regions of the lead frame 110 forming the first heat dissipation region 117 and the second heat dissipation region 118 are continuous in the Y direction through the wall portion 119*a*. That is, in a cross-sectional view in the Y direction, the first heat dissipation region 117 and the second heat dissipation region 118 are integrally formed. Thus, the first heat dissipation region 117 of the lead frame 110 and the position where the semiconductor element 30 is mounted are continuously provided.

In FIG. 6, it is assumed that the heat generated in the semiconductor element 30 is conducted from the front surface 11a of the second heat dissipation region 118 to a second heat dissipation surface 118a (back surface 11b) with an angular spread of 45°, and the spread of heat is indicated by a dashed-dotted line L1. In order to efficiently dissipate the heat generated by the semiconductor element 30 under this assumption, in the semiconductor device 100 in an example, the Y-direction size of a region of the second heat dissipation surface 118a of the second heat dissipation region 118 facing the semiconductor element 30 is larger than the width of the semiconductor element 30 in the Y direction.

For example, as shown in FIG. 6, in portions of the second heat dissipation region 118 between which the first heat dissipation region 117 is interposed, the position of an edge 118c of the second heat dissipation surface 118a in the Y direction is offset outward from the position of an edge 30a of the semiconductor element 30 by a distance equal to or greater than the thickness of the lead frame 110. In addition, the edge 118c of the second heat dissipation surface 118a and the edge 30a of the semiconductor element 30 are edges farther from the first heat dissipation region 117 in the Y direction. That is, the position of the edge 118c of the second heat dissipation surface 118a is the same as the position of the third side 14 and the position of the fourth side 15.

In addition, the Y-direction position of an edge 118d of the second heat dissipation surface 118a close to the first heat dissipation region 117 is offset inward from the position of an edge 30b of the semiconductor element 30 close to the first heat dissipation region 117 by a distance equal to or greater than the thickness of the lead frame 110. Thus, the Y-direction width of the portions of the second heat dissipation region 118 between which the first heat dissipation region 117 is interposed is larger than the width of the semiconductor element 30 in the Y direction by twice or more the thickness T3 of the second heat dissipation region 118.

Figure 7:
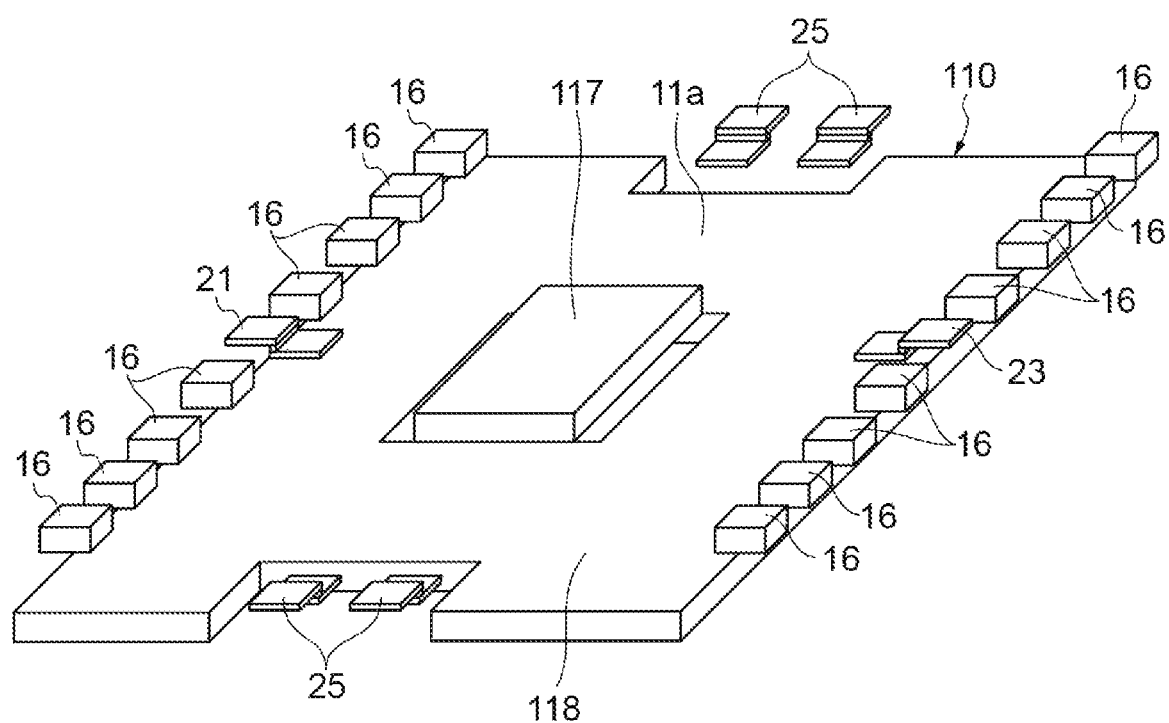
FIG. 7 is a schematic diagram showing steps of a semiconductor device manufacturing method in an example.

FIGS. 7 to 10 are schematic diagrams showing the steps of a method for manufacturing the semiconductor device 100 in an example. In the manufacturing method in an example, first, each member forming the semiconductor device 100, that is, the lead frame 110, the external terminal 20, the semiconductor element 30, and the matching circuit board 40 are prepared. As shown in FIG. 7, the lead frame 110 and the external terminal 20 are arranged at predetermined positions so as to have a positional relationship therebetween in the completed semiconductor device 100.

Figure 8:
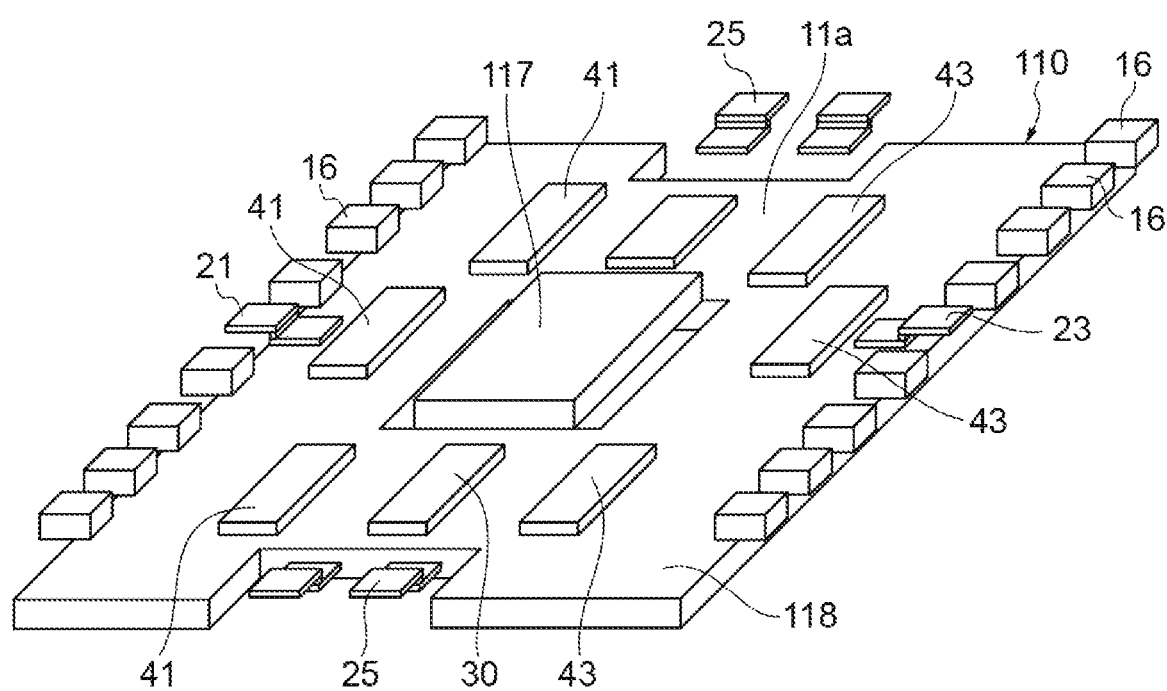
FIG. 8 is a schematic diagram showing steps of the semiconductor device manufacturing method in an example.
Figure 8:
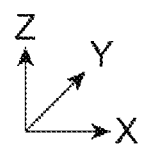

Subsequently, as shown in FIG. 8, the semiconductor element 30 and the matching circuit board 40 are mounted at predetermined positions on the front surface 11a of the second heat dissipation region 118 of the lead frame 110. For example, the semiconductor element 30 and the matching circuit board 40 are bonded onto the lead frame 110 with a conductive adhesive.

Figure 9:
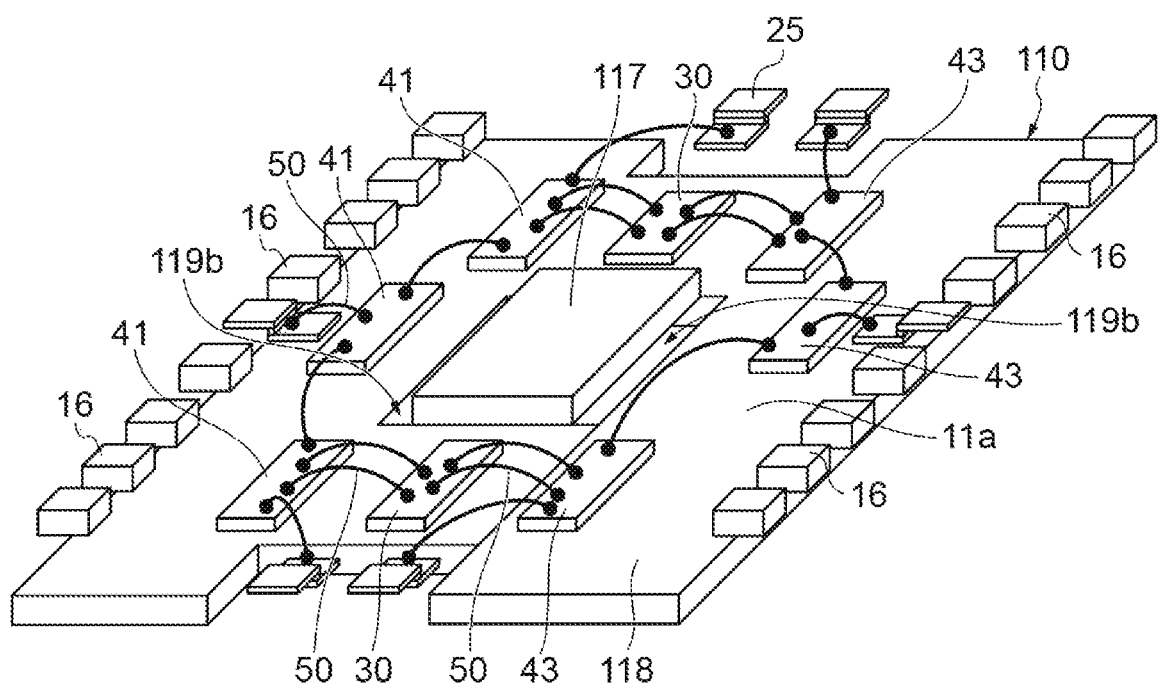
FIG. 9 is a schematic diagram showing steps of the semiconductor device manufacturing method in an example.
Figure 9:
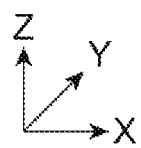

Subsequently, as shown in FIG. 9, the external terminal 20 and each of the semiconductor element 30 and the matching circuit board 40 are connected to each other by the bonding wire 50. Therefore, the semiconductor element 30 and the matching circuit board 40 are electrically connected to the external terminal 20. In the illustrated example, the input signal terminal 21 and the input circuit board 41 are electrically connected to each other by the bonding wire 50, the input circuit board 41 and the semiconductor element 30 are electrically connected to each other by the bonding wire 50, the input circuit board 41 and the power supply terminal 25 are electrically connected to each other by the bonding wire 50, the semiconductor element 30 and the output circuit board 43 are electrically connected to each other by the bonding wire 50, the output circuit board 43 and the power supply terminal 25 are electrically connected to each other by the bonding wire 50, and the output circuit board 43 and the output signal terminal 23 are electrically connected to each other by the bonding wire 50.

Figure 10:
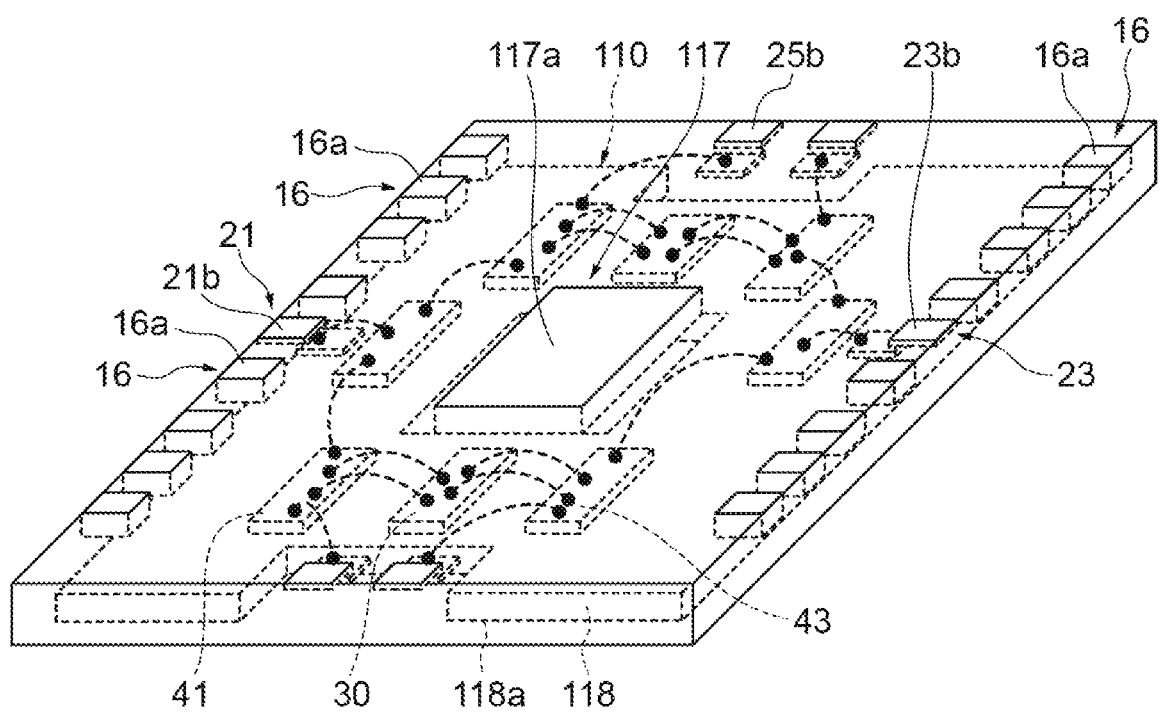
FIG. 10 is a schematic diagram showing steps of the semiconductor device manufacturing method in an example.

Subsequently, as shown in FIG. 10, the lead frame 110, the external terminal 20, the semiconductor element 30, the matching circuit board 40, and the bonding wire 50 are sealed with the resin material 60. The first heat dissipation surface 117a and the second heat dissipation surface 118a of the lead frame 110 are exposed from the resin material 60 in a state sealed with the resin material 60. Similarly, the second portion 25b of the power supply terminal 25, the second portion 21b of the input signal terminal 21, the second portion 23b of the output signal terminal 23, and the first portion 16a of the ground terminal 16 are also exposed from the resin material 60.

In an example, in a step of sealing using the resin material 60, the resin material 60 is injected around the lead frame 110, the external terminal 20, the semiconductor element 30, the matching circuit board 40, and the bonding wire 50 along the X direction. For example, in this step, a mold defining a space corresponding to the outer shape of the semiconductor device 100 may be used. That is, the resin material 60 may be injected into the mold in a state in which the lead frame 110, the external terminal 20, the semiconductor element 30, the matching circuit board 40, and the bonding wire 50 connected to each other are arranged in the mold. In this case, the resin material 60 is injected into the mold along the X direction. For example, the resin material 60 may be injected into the mold in a direction from the front surface 11a side facing the first side 12 toward the second side 13 or in a direction from the front surface 11a side facing the second side 13 toward the first side 12.

As described above, the semiconductor device 100 in an example includes a package 100P having a top surface 100Pa and a bottom surface 100Pb, the semiconductor element 30 arranged in the package 100P, and the lead frame 110 which is arranged in the package 100P and on which the semiconductor element 30 is mounted, the first heat dissipation surface 117a forming the top surface of the lead frame 110 is exposed to the top surface 100Pa of the package 100P, and the second heat dissipation surface 118a forming the bottom surface of the lead frame 110 is exposed to the bottom surface 100Pb of the package 100P.

In addition, the semiconductor device 100 in an example includes the lead frame 110 having the front surface 11a, on which the semiconductor element 30 electrically connected to the external terminal 20 is mounted, and the back surface 11b opposite to the front surface 11a. The lead frame 110 includes the rectangular plate-shaped first heat dissipation region 117 having the first heat dissipation surface 117a for dissipating heat from the front surface 11a and the second heat dissipation region 118 having the second heat dissipation surface 118a for dissipating heat from the back surface 11b, surrounding the four sides of the first heat dissipation region 117, and having a rectangular outer shape. The external terminal 20 is arranged along the first side 12, which is one of the four sides defining the outer shape of the second heat dissipation region 118. In the X direction in which the first side 12 and the second side 13, which is one of the four sides facing the first side 12, are connected to each other, the first heat dissipation region 117 and the second heat dissipation region 118 are spaced apart from each other. In the Y direction crossing the X direction, the first heat dissipation region 117 and the second heat dissipation region 118 are continuous with each other.

In addition, the semiconductor device manufacturing method in an example includes a step of mounting the semiconductor element 30 on the front surface 11a of the second heat dissipation region 118, a step of arranging the external terminal 20 electrically connected to the semiconductor element 30 by the bonding wire 50, and a step of sealing the lead frame 110, the external terminal 20, the semiconductor element 30, and the like with the resin material 60. In the step of sealing using the resin material 60, the resin material 60 is injected around the lead frame 110, the external terminal 20, and the semiconductor element 30 along the X direction.

In the semiconductor device 100 described above, the heat generated by the semiconductor element 30 is conducted to the second heat dissipation surface 118a of the second heat dissipation region 118 and is also conducted to the first heat dissipation surface 117a through the wall portion 119a. Therefore, the heat generated by the semiconductor element 30 can be efficiently dissipated as in the semiconductor device 1. In addition, the spaced region (slit 119b) between the first heat dissipation region 117 and the second heat dissipation region 118 allows the front surface 11a side and the back surface 11b side of the lead frame 110 to communicate with each other. Therefore, in the manufacturing method described above, for example, the resin material 60 injected from the front surface 11a side can be easily made to flow to the back surface 11b side, thereby suppressing the generation of voids and the like. In addition, since the external terminal 20 faces the first side 12 and the second side 13, the bonding wire 50 can easily extend along the X direction. In the step of injecting the resin material 60, the resin material 60 flows along the X direction, so that the flowing direction of the resin material 60 and the extending direction of the bonding wire 50 tend to match. Therefore, the bonding wire 50 is prevented from being damaged by the flowing resin material 60.

The thickness of the ground terminal 16 in an example is smaller than the thicknesses of the first heat dissipation region 117 and the second heat dissipation region 118. In this configuration, since the thermal resistance of the ground terminal 16 is increased, conduction of the heat generated by the semiconductor element 30 to the ground terminal 16 is suppressed. Therefore, a rise in the temperature of the solder at the ground terminal 16 is suppressed.

In addition, in the example of FIG. 4, an example is shown in which the ground terminal 16 is arranged along the first side 12 and the second side 13 extending in the Y direction and the wall portion 119a is formed along the X direction. In this example, since the semiconductor element 30 can be brought close to the wall portion 119a, the heat generated by the semiconductor element 30 can be easily conducted to the first heat dissipation surface 117a.

Figure 11:
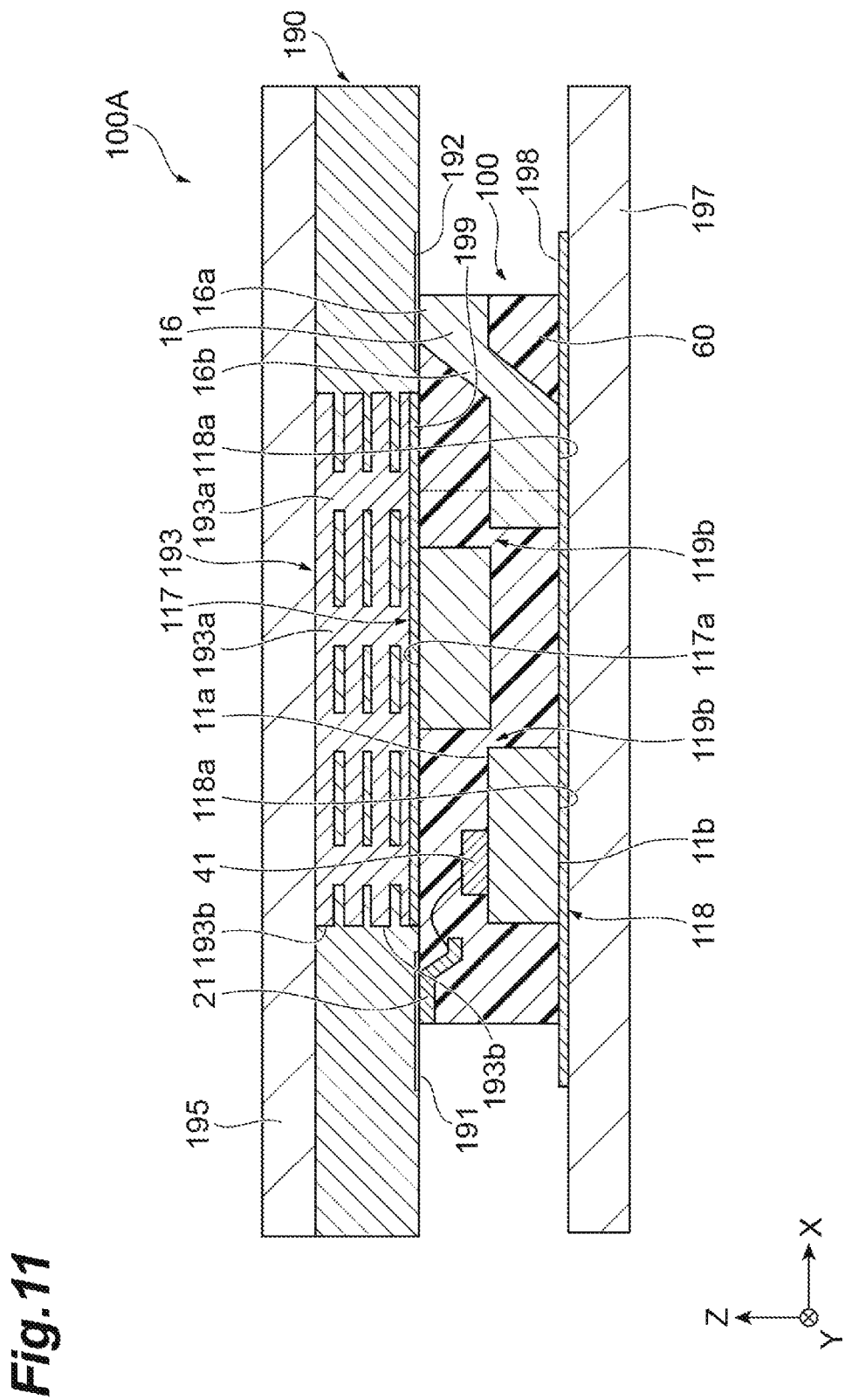
FIG. 11 is a cross-sectional view showing an example of a semiconductor device in which the semiconductor device shown in FIG. 5 is mounted on a substrate.

FIG. 11 is a cross-sectional view showing an example of a semiconductor device in which the semiconductor device 100 shown in FIG. 5 is mounted on a substrate. As shown in FIG. 11, in a semiconductor device 100A, the input signal terminal 21 of the semiconductor device 100 is connected to a signal line 191 (circuit pattern) formed on a substrate 190. In addition, the ground terminal 16 is connected to a ground wiring 192 (circuit pattern) formed on the substrate 190. In an example, the substrate 190 has a heat conducting region 193, which is formed by a via hole 193a and a wiring 193b, at a position corresponding to the first heat dissipation region 117. The heat conducting region 193 can have, for example, a plurality of via holes 193a and the wiring 193b for connecting the via holes 193a in the outer layer and the inner layer of the substrate 190. In addition, a heat sink 195 is provided on a surface of the substrate 190 on a side opposite to a surface on which the semiconductor device 100 is mounted. In a state in which the semiconductor device 100 is mounted on the substrate 190, the entire first heat dissipation surface 117a of the first heat dissipation region 117 is in contact with the heat conducting region 193. That is, when viewed from the Z direction, the heat conducting region 193 has an area larger than that of the first heat dissipation surface 117a, and overlaps the first heat dissipation surface 117a. The heat sink 195 is thermally connected to the first heat dissipation surface 117a through the heat conducting region 193. The heat conducting region 193 is fixed to the first heat dissipation surface 117a in a state in which the heat conducting region 193 is thermally connected through a high heat conducting adhesive 199. In addition, in the example of FIG. 11, another heat sink 197 is provided on the second heat dissipation surface 118a side of the second heat dissipation region 118. The heat sink 197 is fixed to the semiconductor device 100 in a state in which the heat sink 197 is in thermal contact with the second heat dissipation surface 118a through a high heat conducting adhesive 198.

Figure 12:
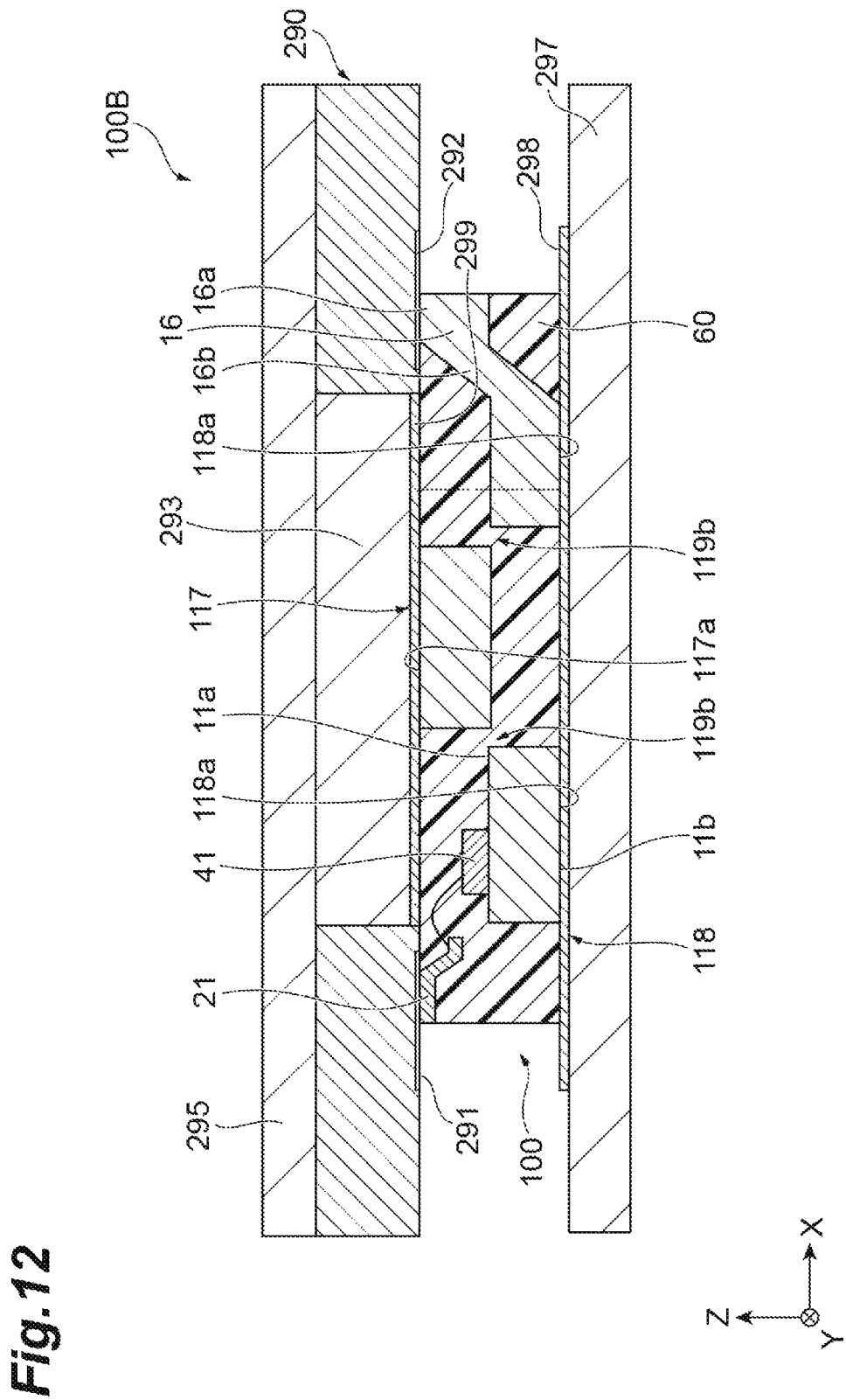
FIG. 12 is a cross-sectional view showing another example of a semiconductor device in which the semiconductor device shown in FIG. 5 is mounted on a substrate.

FIG. 12 is a cross-sectional view showing another example of a semiconductor device in which the semiconductor device 100 shown in FIG. 5 is mounted on a substrate. As shown in FIG. 12, in a semiconductor device 100B, the input signal terminal 21 of the semiconductor device 100 is connected to a signal line 291 (circuit pattern) formed on a substrate 290. In addition, the ground terminal 16 is connected to a ground wiring 292 (circuit pattern) formed on the substrate 290. In an example, the substrate 290 is a so-called copper inlay substrate having a copper coin 293, which penetrates the substrate 290 in the Z direction, at a position corresponding to the first heat dissipation region 117. A heat sink 295 is provided on a surface of the substrate 290 on a side opposite to a surface on which the semiconductor device 100 is mounted. The heat sink 295 and the copper coin 293 are in contact with each other. In a state in which the semiconductor device 100 is mounted on the substrate 290, the entire first heat dissipation surface 117a of the first heat dissipation region 117 is in contact with the copper coin 293. That is, when viewed from the Z direction, the copper coin 293 has an area larger than that of the first heat dissipation surface 117a, and overlaps the first heat dissipation surface 117a. The heat sink 295 is thermally connected to the first heat dissipation surface 117a through the copper coin 293. The copper coin 293 is fixed to the first heat dissipation surface 117a in a state in which the copper coin 293 is thermally connected through a high heat conducting adhesive 299. In addition, in the example of FIG. 12, another heat sink 297 is provided on the second heat dissipation surface 118a side of the second heat dissipation region 118. The heat sink 297 is fixed to the semiconductor device 100 in a state in which the heat sink 297 is in thermal contact with the second heat dissipation surface 118a through a high heat conducting adhesive 298.

What is claimed is:
1. A semiconductor device, comprising:
a package having a top surface and a bottom surface;
a semiconductor element arranged in the package; and
a base arranged in the package and on which the semiconductor element is mounted, wherein:
the base comprises a lead frame body to which the semiconductor element is mounted, and a plurality of ground terminals provided on a peripheral edge of the lead frame body,
the lead frame body comprises a first heat dissipation region disposed in a center of the lead frame body in plan view and is configured from a columnar region protruding in a direction from the bottom surface toward the top surface of the package, and a second heat dissipation region that is a region surrounding the first heat dissipation region in the plan view,
the plurality of ground terminals contact the second heat dissipation region and extends outwardly,
a top surface of the first heat dissipation region is exposed to the top surface of the package, and
a bottom surface of the second heat dissipation region is exposed to the bottom surface of the package.

2. The semiconductor device according to claim 1, wherein the top surface of the first heat dissipation region and bottom surface of the second heat dissipation region are thermally connected to an external heat sink.

3. The semiconductor device according to claim 1, further comprising:
an external terminal electrically connected to the semiconductor element and having a surface exposed from the top surface or the bottom surface of the package.

4. The semiconductor device according to claim 1, wherein a plurality of the semiconductor elements is mounted on the base.

5. The semiconductor device according to claim 4, wherein the top surface of the first heat dissipation region is provided between the plurality of semiconductor elements.

6. The semiconductor device according to claim 1, wherein the base has a slit between the top surface of the first heat dissipation region and a position where the semiconductor element is mounted.

7. The semiconductor device according to claim 1, wherein the top surface of the first heat dissipation region and a position where the semiconductor element is mounted are continuously provided.

8. The semiconductor device according to claim 1, further comprising:
a ground terminal having a surface exposed to the top surface of the package and electrically connected to the base.

9. The semiconductor device according to claim 8, wherein a thickness of the ground terminal is smaller than a thickness of the base.

10. A method for manufacturing a semiconductor device, the method comprising the method comprising:
forming a base of a package, wherein the base includes:
a lead frame body, wherein the lead frame body comprises a first heat dissipation region disposed in a center of the lead frame body in plan view and is configured from a columnar region protruding in a direction from a bottom surface toward a top surface of the package, and a second heat dissipation region that is a region surrounding the first heat dissipation region in the plan view and
a plurality of ground terminals on a peripheral edge of the lead frame body that contact the second heat dissipation region and extend outwardly, wherein a top surface of the first heat dissipation region is exposed to the top surface of the package and a bottom surface of the second heat dissipation region is exposed to the bottom surface of the package;
mounting a semiconductor element on the lead frame body;
electrically connecting the semiconductor element and an external terminal to each other with a conductive member; and
sealing the base, the external terminal, and the semiconductor element with a resin material.

11. The method according to claim 10, wherein the base has a slit between the top surface of the first heat dissipation region and a position where the semiconductor element is mounted, and
wherein the sealing using the resin material includes injecting resin into the slit of the base.

* * * * *